United States Patent
Zhang et al.

(10) Patent No.: US 10,741,626 B1
(45) Date of Patent: Aug. 11, 2020

(54) DISPLAY PANELS AND DISPLAY DEVICES

(71) Applicant: Shanghai Tianma Micro-Electronics Co., Ltd., Shanghai (CN)

(72) Inventors: Qing Zhang, Shanghai (CN); Qijun Yao, Shanghai (CN); Xiaoyue Su, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/454,778

(22) Filed: Jun. 27, 2019

(30) Foreign Application Priority Data

Feb. 28, 2019 (CN) .......................... 2019 1 0149465

(51) Int. Cl.
H01L 27/32 (2006.01)
H01L 29/786 (2006.01)
H01L 27/12 (2006.01)

(52) U.S. Cl.
CPC ...... H01L 27/3262 (2013.01); H01L 27/3276 (2013.01); H01L 27/1225 (2013.01); H01L 27/1244 (2013.01); H01L 27/1251 (2013.01); H01L 29/7869 (2013.01); H01L 29/78675 (2013.01); H01L 2251/5392 (2013.01)

(58) Field of Classification Search
CPC ............. H01L 27/1225; H01L 27/1244; H01L 27/1251; H01L 27/3262; H01L 27/3276; H01L 29/7869; H01L 29/78675; H01L 2251/5392
See application file for complete search history.

(56) References Cited

U.S. PATENT DOCUMENTS

2018/0053470 A1* 2/2018 Morita ................ G09G 3/3258
2018/0062105 A1* 3/2018 Lius .................... H01L 27/3262

FOREIGN PATENT DOCUMENTS

| CN | 104681564 A | 6/2015 |
| CN | 105612620 A | 5/2016 |
| CN | 106920515 A | 7/2017 |

* cited by examiner

*Primary Examiner* — Peniel M Gumedzoe
(74) *Attorney, Agent, or Firm* — Anova Law Group PLLC

(57) ABSTRACT

A display panel and a display device are provided. The display panel includes a base substrate and a plurality of pixel units disposed on the base substrate. Each of the plurality of pixel units includes a drive thin film transistor, a switch thin film transistor, a reset thin film transistor, and an organic light-emitting device. For each of the switch thin film transistor and the reset thin film transistor, in a direction perpendicular to a plane of the base substrate, a source and a drain are respectively located at two sides of a gate. The drain of the switch thin film transistor is electrically connected to a gate of the drive thin film transistor, and the drain of the reset thin film transistor is electrically connected to a drain of the drive thin film transistor. The drain of the drive thin film transistor is coupled to the organic light-emitting device.

20 Claims, 9 Drawing Sheets

DISPLAY PANELS AND DISPLAY DEVICES

CROSS-REFERENCES TO RELATED APPLICATIONS

This application claims priority of Chinese Patent Application No. 201910149465.6, filed on Feb. 28, 2019, the entire content of which is hereby incorporated by reference.

FIELD OF THE DISCLOSURE

The present disclosure generally relates to the field of display technology and, more particularly, relates to display panels and display devices.

BACKGROUND

With development of science and technology, display devices with display panels have become more widely used, and people's requirements for display panels have become more diverse. Conventional performance parameters of a display panel, such as large size, high definition and the like, may not fully satisfy people's requirements, and people may have a higher requirement for Pixels Per Inch (PPI) of a display panel.

The PPI of a display panel is a unit of image resolution, indicating a number of pixels per inch of the display panel. When the PPI of a display panel reaches a certain value, human eyes may not distinguish graininess. In the prior art, to achieve normal light-emitting of pixels, a series of circuit structures may be introduced in a display panel, and spaces occupied by the circuit structures may directly influence the PPI. Accordingly, how to realize high PPI designs of display panels is one of technical problems that urgently need to be solved.

The disclosed methods and structures are directed to solve one or more problems set forth above and other problems in the art.

SUMMARY

One aspect of the present disclosure includes a display panel. The display panel includes a base substrate and a plurality of pixel units disposed on the base substrate. Each of the pixel units includes a drive thin film transistor, a switch thin film transistor, a reset thin film transistor, and an organic light-emitting device. In a direction perpendicular to a plane of the base substrate, a source and a drain of the switch thin film transistor are respectively located at two sides of a gate of the switch thin film transistor, and a source and a drain of the reset thin film transistor are respectively located at two sides of a gate of the reset film the transistor. The drain of the switch thin film transistor is electrically connected to a gate of the drive thin film transistor, and the drain of the reset thin film transistor is electrically connected to a drain of the drive thin film transistor. The drain of the drive thin film transistor is coupled to the organic light-emitting device.

Another aspect of the present disclosure includes a display device. The display device includes a display panel including a base substrate and a plurality of pixel units disposed on the base substrate. Each of the pixel units includes a drive thin film transistor, a switch thin film transistor, a reset thin film transistor, and an organic light-emitting device. In a direction perpendicular to a plane of the base substrate, a source and a drain of the switch thin film transistor are respectively located at two sides of a gate of the switch thin film transistor, and a source and a drain of the reset thin film transistor are respectively located at two sides of a gate of the reset film the transistor. The drain of the switch thin film transistor is electrically connected to a gate of the drive thin film transistor, and the drain of the reset thin film transistor is electrically connected to a drain of the drive thin film transistor. The drain of the drive thin film transistor is coupled to the organic light-emitting device.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
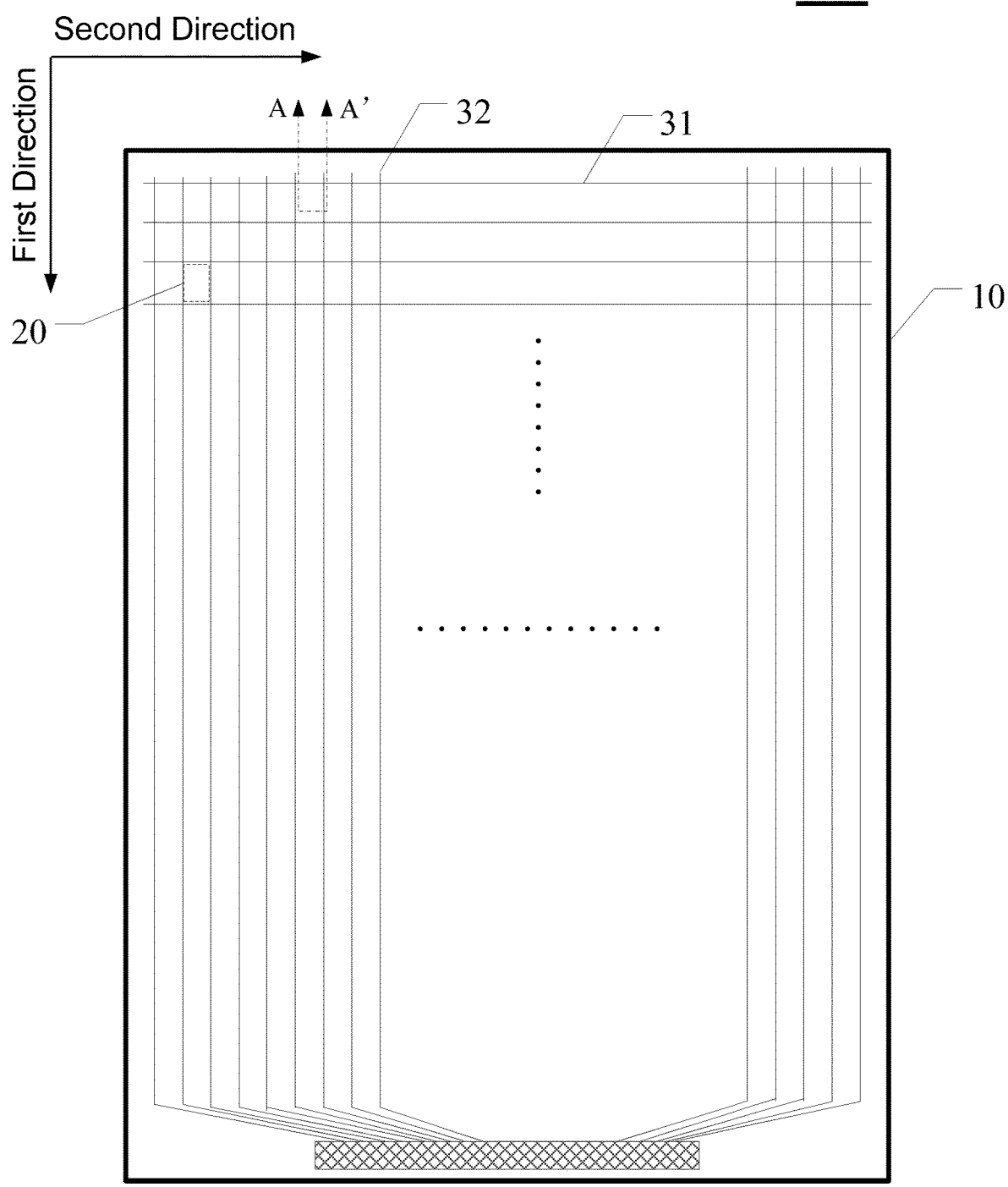
FIG. 1 illustrates a top view of an exemplary display panel consistent with the disclosed embodiments.

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

A PPI of a display panel is a unit of image resolution, indicating a number of pixels per inch of the display panel. When the PPI of a display panel reaches a certain value, human eyes may not distinguish graininess. In the prior art, to achieve normal light-emitting of pixels, a series of circuit structures may be introduced in a display panel, and spaces occupied by the circuit structures may directly influence the PPI. Accordingly, how to realize high PPI designs of display panels is one of technical problems that urgently need to be solved.

The present disclosure provides a display panel and a display device. Sources and drains of a switch thin film transistor and a reset thin film transistor are disposed at two sides of gates, and thus areas occupied by the switch thin film transistor and the reset thin film transistor on the display panel may be reduced. Areas saved may be used for disposing more pixel units, and high PPI designs of the display panel and the display device may thus be realized.

The present disclosure provides a display panel, including a base substrate and a plurality of pixel units disposed on the base substrate. Each of the pixel units includes a drive thin film transistor, a switch thin film transistor, a reset thin film transistor, and an organic light-emitting device.

In a direction perpendicular to a plane of the base substrate, the source and the drain of the switch thin film transistor are respectively located at two sides of the gate of the switch thin film transistor. The source and the drain of the reset thin film transistor are respectively located at two sides of the gate of the reset film the transistor. A drain of the switch thin film transistor is electrically connected to the gate of the drive thin film transistor. A drain of the reset thin film transistor is electrically connected to a drain of the drive thin film transistor. The drain of the drive thin film transistor is coupled to the organic light-emitting device.

Figure 2:
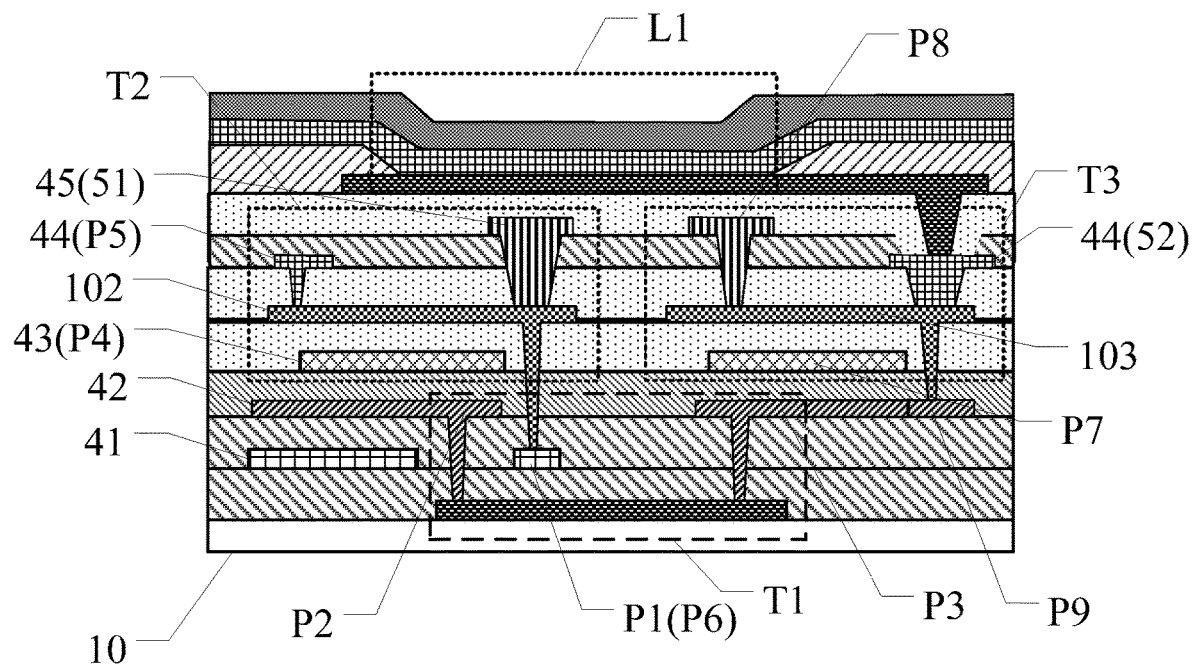
FIG. 2 illustrates is an exemplary cross-sectional view at cross section AA' of the exemplary display panel illustrated in FIG. 1, consistent with the disclosed embodiments.
Figure 3:
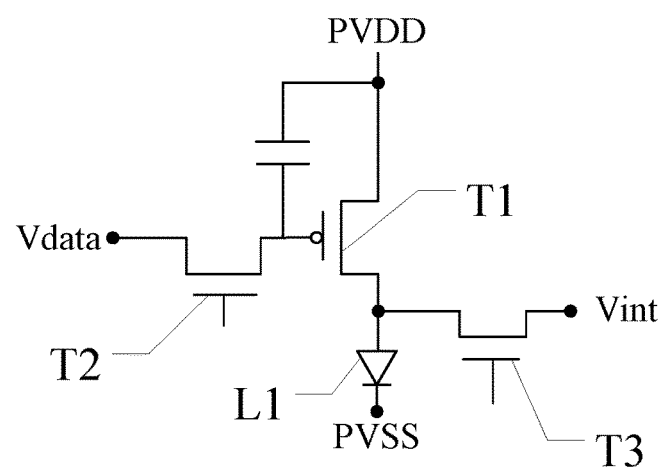
FIG. 3 illustrates an exemplary circuit of a pixel unit in a display panel consistent with the disclosed embodiments.

FIG. 1 illustrates a top view of an exemplary display panel consistent with the disclosed embodiments. FIG. 2 illustrates is an exemplary cross-sectional view at cross section AA' of the exemplary display panel illustrated in FIG. 1. FIG. 3 illustrates an exemplary circuit of a pixel unit in a display panel consistent with the disclosed embodiments.

Referring to FIG. 1 to FIG. 3, a display panel 100 provided by the present disclosure includes a plurality of pixel units 20. Each of the pixel units 20 includes a drive thin film transistor T1, a switch thin film transistor T2, a reset thin film transistor T3, and an organic light-emitting device L1. To operate the pixel unit 20, referring to FIG. 3, firstly the reset thin film transistor T3 is turned on, the switch thin film transistor T2 and driving the thin film transistor T1 are turned off, and signals of an anode of the organic light-emitting device L1 is reset. Next, the reset thin film transistor T3 is turned off, and the switch thin film transistor T2 is turned on. A data signal Vdata is transmitted to a gate of the drive thin film transistor T1 through the switch thin film transistor T2. The drive thin film transistor T1 is then turn on, driving the organic light-emitting device L1 in the pixel unit 20 to emit light.

Referring to FIG. 2 and FIG. 3, a drain P6 of the switch thin film transistor T2 is electrically connected to a gate P1 of the drive thin film transistor T1; and a drain P9 of the reset thin film transistor T3 is electrically connected to a drain P3 of the drive thin film transistor T1. Moreover, a source P5 and the drain P6 of the switch thin film transistor T2 are respectively located at two sides of a gate P4 of the switch thin film transistor T2; and a source P8 and the drain P9 of the reset thin film transistor T3 are also respectively located at the two sides of a gate P7 of the reset thin film transistor T3. It should be noted that the two sides of the gate P4 or the two sides of the gate P7 mentioned in the present disclosure refers to two sides in a stacking direction of film layers.

Accordingly, electrical connection between the drain P6 of the switch thin film transistor T2 and the gate P1 of the drive thin film transistor T1 may be realized through a through-hole, and no bridges are needed. Meanwhile, electrical connection between the drain P9 of the reset thin film transistor T3 and the drain P3 of the drive thin film transistor T1 may be realized through a through-hole, and no bridges are needed. In this way, areas occupied by the switching transistor T2 and the reset thin film transistor T3 on the display panel 100 may be reduced, and a certain space of the display panel 100 may be saved. The saved space of the display panel 100 may be used for disposing more pixel units 20. Accordingly, high PPI designs of the display panel 100 may be realized, and resolution of the display panel 100 may be improved. Thus, displayed images may be more fine and clear, and image-display quality of the display panel 100 may be improved.

In the display panel 100 shown in FIG. 1, gate lines 31 and data lines 32 intersect, defining a plurality of pixel units 20. It should be noted that, FIG. 1 is for illustrative purposes only, and does not represent actual sizes and numbers of the gate lines 31, the data lines 32 and the pixel units 20. The cross-sectional view shown in FIG. 2 only schematically illustrates relative positional relationships between film layers, and does not represent actual structures and sizes of the film layers.

In one embodiment, in the display panel 100, the switch thin film transistor T2 and the reset thin film transistor T3 may be oxide thin film transistors, and the drive thin film transistor T1 may be a low temperature polysilicon thin film transistor.

For example, when oxide thin film transistors are used as the switch thin film transistor T2 and the reset thin film transistor T3, the switch thin film transistor T2 and the reset thin film transistor T3 may have a low electron mobility and a small leakage. Accordingly, the resolution of the display panel 100 may be improved, images of the display panel 100 may be realistic, and a refresh rate of the display panel 100 may be high. Meanwhile, light transmittance rate may be improved, and energy consumption may be reduced. When a low-temperature polysilicon thin film transistor is used as the drive thin film transistor T1, the drive thin film transistor T1 may have high electron mobility, fast response speed, high integration, low power consumption and strong anti-light interference capability.

In the present disclosure, the switch thin film transistor T2 and the reset thin film transistor T3 are oxide thin film transistors. The sources and drains of the switch thin film transistor T2 and the reset thin film transistor T3 are respectively located at two sides of the gates. Accordingly, the resolution of the display panel 100 may be improved, and image display effect of the display panel 100 may thus be improved.

Figure 4:
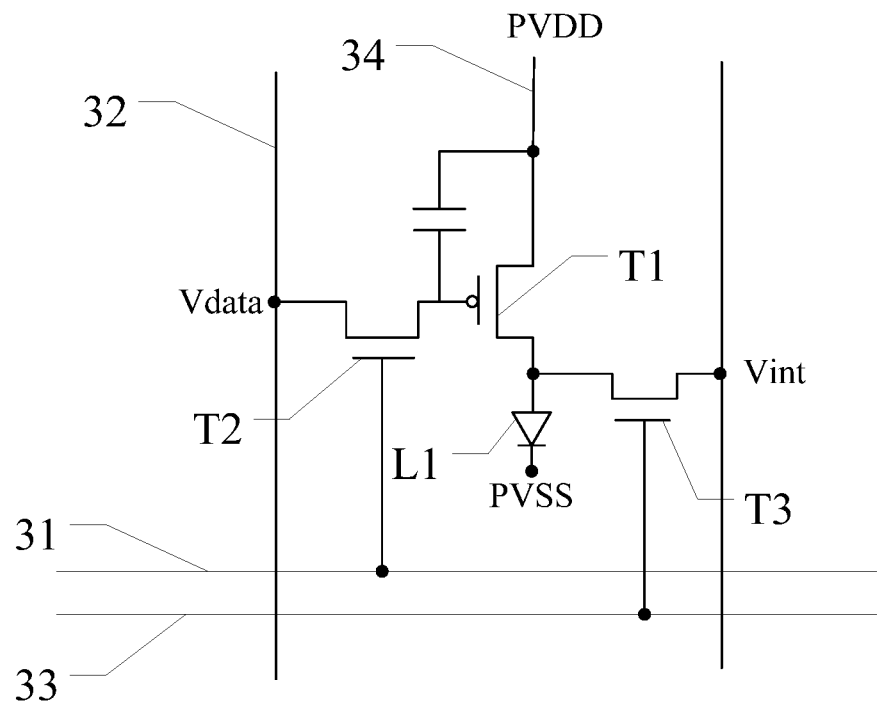
FIG. 4 illustrates an exemplary circuit structure of a pixel unit in a display panel consistent with the disclosed embodiments.

FIG. 4 illustrates an exemplary circuit structure of the pixel unit 20 in the display panel 100 consistent with the disclosed embodiments. The display panel 100 also includes a plurality of gate lines 31, a plurality of data lines 32, a plurality of reset signal lines 33, and a plurality of power signal lines 34, which are insulated from each other.

The gate of each switch thin film transistor T2 is connected to the gate line 31, and the source of each switch thin film transistor T2 is connected to the data line 32. The source of each drive thin film transistor T1 is connected to the power signal line 34. The gate of each reset thin film transistor T3 is connected to the reset signal line 33, and the source of each reset thin film transistor T3 is connected to reset voltage signals.

For example, in the display panel 100, the gate of the switch thin film transistor T2 is connected to the gate line 31, receiving gate control signals transmitted through the gate line 31, and turns the switch thin film transistor T2 on or off under control of the gate control signals. The source of the switch thin film transistor T2 is connected to the data line 32, and the drain of the switch thin film transistor T2 is connected to the gate of the drive thin film transistor T1. When the switch thin film transistor T2 is turned on, data signals in the data line 32 is transmitted to the drive thin film transistor T1 through the switch thin film transistor T2, and the drive thin film transistor T1 is then turned on. Power supply signals in the power signal line 34 is then transmitted to the organic light-emitting device L1 to make the organic light-emitting device L1 to emit light. The source of the reset thin film transistor T3 is connected to reset voltage signals. Before scanning a pixel unit 20, the reset thin film transistor T3 is first turned on, and the reset voltage signal is then sent to the organic light-emitting device L1. Then, the organic light-emitting device L1 is reset to an initial state to prevent display data of a previous frame from affecting display of a current frame.

In one embodiment, referring to FIG. 2, the display panel 100 also includes a low temperature polysilicon channel layer, a first metal layer 41, a second metal layer 42, a third metal layer 43, an oxide channel layer 102/103, a fourth metal layer 44, and a fifth metal layer 45, which are disposed in sequence on the base substrate in a direction perpendicular to the base substrate.

The gate P1 of the drive thin film transistor T1 is located at the first metal layer 41, and the source P2 and the drain P3 of the drive thin film transistor T1 are located at the second metal layer 42. The gate P4 of the switch thin film transistor T2 and the gate P7 of the reset thin film transistor T3 are located at the third metal layer 43, and the source P5 of the switch thin film transistor T2 is located at the fourth metal layer 44. The source P8 of the reset thin film transistor T3 is located at the fifth metal layer 45. The drain P6 of the switch thin film transistor T2 is located between in the oxide channel layer 102 and the base substrate 10. The drain P9 of the reset thin film transistor T3 is located between the oxide channel layer 103 and the first metal layer 41.

For example, in the display panel 100, the drive thin film transistor T1, the switch thin film transistor T2, and the reset thin film transistor T3 are simultaneously introduced in the pixel unit 20. FIG. 2 shows exemplary layer arrangement relationships of film layers of the three transistors. The drive thin film transistor T1 is disposed at a side closest to the base substrate, that is, the low temperature polysilicon channel layer. The gate P1 is located at the first metal layer 41, and the source P2 and the drain P3 are located at the second metal layer 42. The switch thin film transistor T2 and the reset thin film transistor T3 are respectively located at a side of the drive thin film transistor T1 away from the base substrate. The gate P4 of the switch thin film transistor T2 and the gate P7 of the reset thin film transistor T3 are located at the third metal layer 43. The source P5 of the switch thin film transistor T2 is located at the fourth metal layer 44, and the drain P6 of the switch thin film transistor T2 is located between the oxide channel layer 102 and the substrate 10. The source P8 of the reset thin film transistor T3 is located at the fifth metal layer 45, and the drain P9 of the reset thin film transistor T3 is located between the oxide channel layer 103 and the first metal layer 41.

As such, the sources of the switch thin film transistor T2 and the reset thin film transistor T3 are disposed at a side of the oxide channel layer 102/103 away from the base substrate, and the drains are disposed at a side of the oxide channel layer 102/103 close to the base substrate. Bridge structures for electrically connecting the switch thin film transistor T2 and the reset thin film transistor T3, respectively, with the drive thin film transistor T1 may be avoided. Accordingly, areas occupied by the switch thin film transistor T2 and the reset thin film transistor T3 on the display panel 100 may be reduced, and high PPI designs of the display panel 100 may be realized.

It should be noted that, in the embodiment shown in FIG. 2, each of the metal layers is separated by insulating layers. FIG. 2 shows an exemplary film layer stack structure integrating three transistors, including the drive thin film transistor T1, the switch thin film transistor T2, and the reset thin film transistor T3. In some other embodiments, the three transistors may have other film layer stack structures. The present disclosure does not limit film layer stack structures of the three transistors.

In one embodiment, referring to FIG. 2, the display panel 100 also includes a first metal line 51. The first metal line 51 is located at a side of the oxide channel layer 102 of the switch thin film transistor T2 away from the base substrate 10.

The first metal line 51 is electrically connected to the oxide channel layer 102 of the switch thin film transistor T2 through a first through-hole. Orthographic projections of the first metal line 51 and the gate P4 and the drain P6 of the switch thin film transistor T2 on the plane of the base substrate 10 overlap. Orthographic projections of the source P5 and the gate P4 of the switch thin film transistor T2 on the plane of the substrate overlap.

For example, referring to FIG. 2, the first metal line 51 is disposed at a side of the oxide channel layer of the thin film transistor T2 away from the base substrate 10. The orthographic projection of the first metal line 51 on the base substrate overlaps with the orthographic projections of the gate P4 and the drain P6 of the switch thin film transistor T2 on the base substrate. The first metal line 51 is electrically connected to the oxide channel layer 102 of the switch thin film transistor T2 through a through-hole. In this configuration, a voltage of the source P5 of the switch thin film transistor T2 may be transmitted to the first metal line 51 through the oxide channel layer 102, and further transmitted from the first metal line 51 to the drain P6 of the switch thin film transistor T2. Accordingly, an electron mobility of the switch thin film transistor T2 may be increased, and thus a response rate of the switch thin film transistor T2 may be improved.

In one embodiment, referring to FIG. 2, in the display panel 100, the orthographic projection of the first metal line 51 on the plane of the base substrate 10 covers the orthographic projection of the drain P6 of the switch thin film transistor T2 on the plane of the base substrate 10. Generally, after the first metal line 51 is introduced, improvement of the electron mobility of the switch thin film transistor T2 by the first metal line 51 is related to the overlapping area between the first metal line 51 and the gate P4 and the drain P6 of the switch thin film transistor T2. A larger overlapping area may result in a more obvious improvement effect. In the present disclosure, the drain P6 of the switch thin film transistor T2 is covered by the first metal line 51, and the overlapping area between the first metal line 51 and the drain P6 of the switch thin film transistor T2 may be large. Accordingly, the electron mobility of the switch thin film transistor T2 may be improved, and the response rate of the switch thin film transistor T2 may thus be increased.

In one embodiment, referring to FIG. 2, the first metal line 51 and the source P5 of the switch thin film transistor T2 may be located at different film layers.

For example, in consideration of film layer process problems, a line pitch between adjacent metal lines on the display panel 100 is preferably greater than proximately 3 μm. To ensure process feasibility, in the embodiment shown in FIG. 2, when the first metal line 51 and the source P5 of the switch thin film transistor T2 are disposed in different film layers, short circuits between the first metal line 51 and the source P5 may be avoided. Meanwhile, the area occupied by the switch thin film transistor T2 on the display panel 100 may also be reduced, and high PPI designs of the display panel 100 may be achieved.

In one embodiment, the first metal line 51 is located at the fifth metal layer 45. As shown in FIG. 2, the source of the switch thin film transistor T2 is located at the fourth metal layer 44 and the first metal line 51 is located at the fifth metal layer 45.

Figure 5:
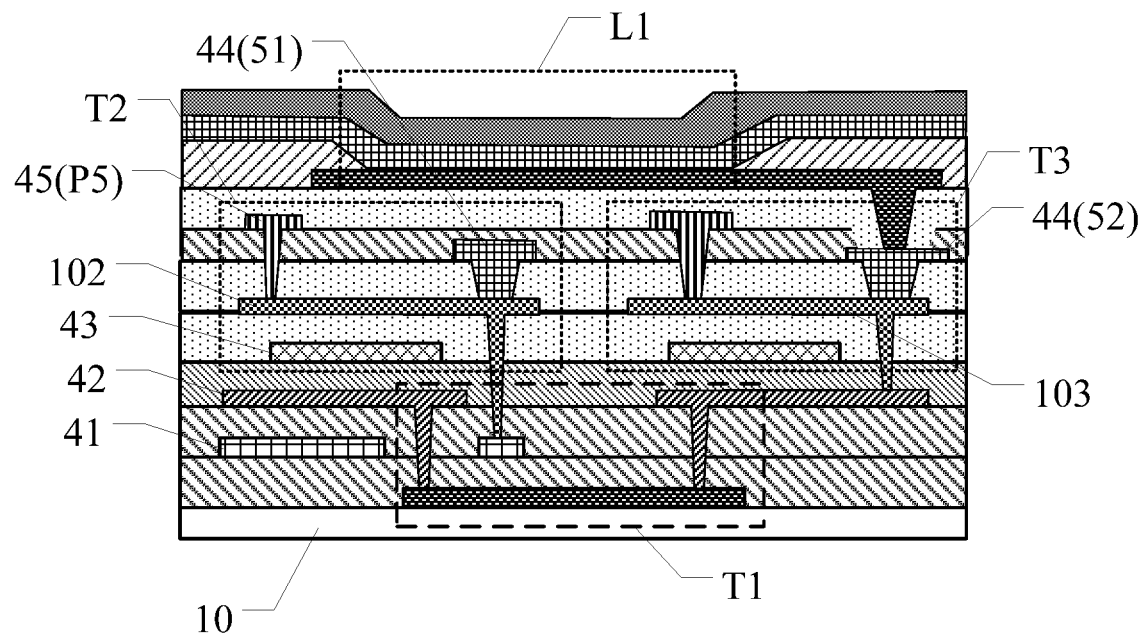
FIG. 5 illustrates another exemplary cross-sectional view at cross section AA' of the exemplary display panel illustrated in FIG. 1, consistent with the disclosed embodiments.

In some other embodiments, the first metal line 51 may be located at the fourth metal layer 44. FIG. 5 illustrates another exemplary cross-sectional view of the AA' of the display panel 100 illustrated in FIG. 1. As shown in FIG. 5, the source P5 of the switch thin film transistor T2 is located at the fifth metal layer 45, and the first metal line 51 is located at the fourth metal layer 44. In this structure, the area occupied by the switch thin film transistor T2 on the display panel 100 may also be reduced, and high PPI designs of panel 100 may also be achieved.

In one embodiment, referring to FIG. 2, in the display panel 100, the gate P1 of the drive thin film transistor T1 may be reused as the drain P6 of the switch thin film transistor T2.

For example, the drain P6 of the switch thin film transistor T2 is electrically connected to the gate P1 of the drive thin film transistor T1. When the gate P1 of the drive thin film transistor T1 is reused as the drain P6 of the switch thin film transistor T2, the drain P6 is electrically connected to the oxide channel layer 102 of the switch thin film transistor T2 through a through-hole. Accordingly, a procedure of separately providing a film layer structure for the drain P6 of the switch thin film transistor T2 may be avoided. Thus, certain production processes may be omitted, production efficiency may be improved, and the film structure of the display panel 100 may be simplified.

In one embodiment, referring to FIG. 2, the display panel 100 also includes a second metal line 52. The second metal line 52 is located at a side of the oxide channel layer 103 of the reset thin film transistor T3 away from the substrate 10. The second metal line 52 is electrically connected to the oxide channel layer 103 of the reset thin film transistor T3 through a second through-hole. Orthographic projections of the second metal line 52, and the gate P7 and the drain P9 of the reset thin film transistor T3 on the plane of the base substrate 10 overlap. Orthographic projections of the source P8 and the gate P7 of the reset thin film transistor T3 on the plane of the base substrate 10 overlap.

For example, referring to FIG. 2, the second metal line 52 is disposed at a side of the oxide channel layer 103 of the reset thin film transistor T3 away from the base substrate 10. An orthographic projection of the second metal line 52 on the base substrate overlaps with orthographic projections of the gate P7 and the drain P9 of the reset thin film transistor T3 on the base substrate. The second metal line 52 is electrically connected to the oxide channel layer 103 of the reset thin film transistor T3 through a through-hole. In this structure, a voltage of the source P8 of the reset thin film transistor T3 may be transmitted to the second metal line 52 through the oxide channel layer 103, and further transmitted from the second metal line 52 to the drain P9 of the reset film transistor T3. Accordingly, an electron mobility of the reset thin film transistor T3 may be increased, and a response rate of the reset thin film transistor T3 may thus be increased.

In one embodiment, referring to FIG. 2, the orthographic projection of the second metal line 52 on the plane of the base substrate 10 covers the drain P9 of the reset thin film transistor T3. Generally, after the second metal line 52 is introduced, the improvement of the electron mobility of the switch thin film transistor T3 by the second metal line 52 is related to the overlapping area between the second metal line 52 and the gate P7 and the drain P9 of the reset thin film transistor T3. A larger overlapping area may result in a more obvious the improvement effect. In the present disclosure, after the drain P9 of the reset thin film transistor T3 is covered by the second metal line 52, the overlapping area between the second metal line 52 and the drain P9 of the reset thin film transistor T3 may be large. Accordingly, the electron mobility of the reset thin film transistor T3 may be improved, and further, the response rate of the reset thin film transistor T3 may be increased.

In one embodiment, the second metal line 52 and the source P8 of the reset thin film transistor T3 may be located at different film layers.

For example, in consideration of film layer process problems, the line pitch between adjacent metal lines on the display panel 100 is preferably greater than approximately 3 μm. To ensure process feasibility, in the embodiment shown in FIG. 2, the second metal line 52 and the source P8 of the reset thin film transistor T3 are disposed at different film layers. Accordingly, short circuits between the second metal line 52 and the source P8 of the reset thin film transistor T3 may be avoided. Meanwhile, an area occupied by the reset thin film transistor T3 on the display panel 100 may be reduced, and thus high PPI designs of the display panel 100 may thus be achieved.

In one embodiment, the second metal line 52 is located at the fourth metal layer 44. As shown in FIG. 2, the source P8 of the reset thin film transistor T3 is located at the fifth metal layer 45 and the second metal line 52 is located at the fourth metal layer 44.

Figure 6:
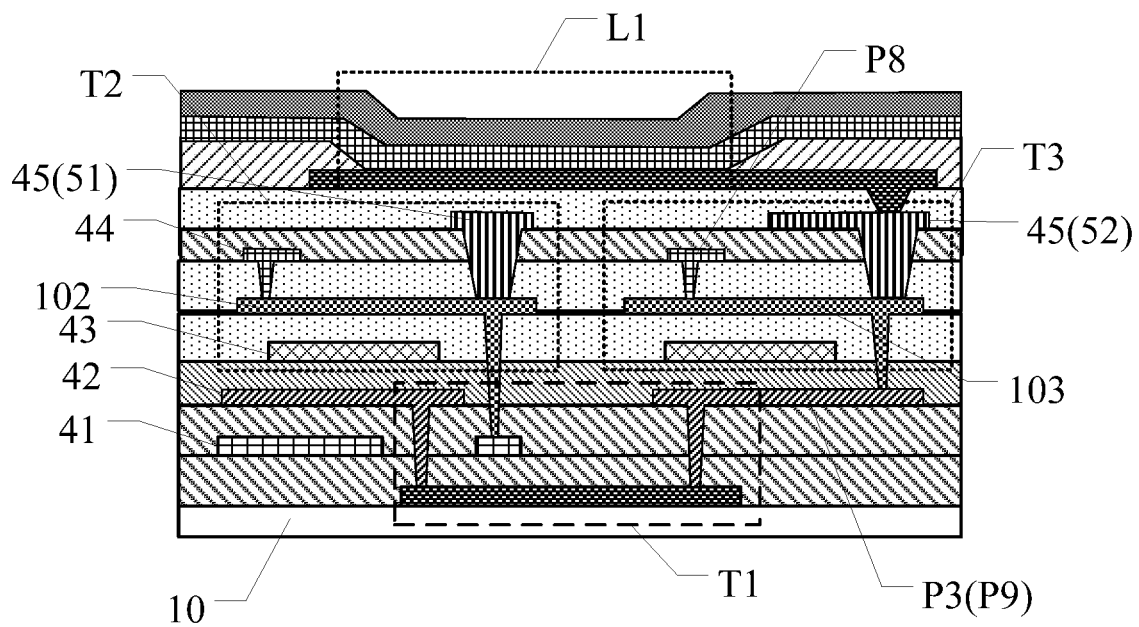
FIG. 6 illustrates another exemplary cross-sectional view at cross section AA' of the exemplary display panel illustrated in FIG. 1, consistent with the disclosed embodiments.

In some other embodiments, the second metal line 52 may be located at the fifth metal layer 45. FIG. 6 illustrates another cross-sectional view at cross section AA' of the display panel 100 illustrated in FIG. 1. As shown in FIG. 6, the source P8 of the reset thin film transistor T3 is located at the fourth metal layer 44, and the second metal line 52 is located at the fifth metal layer 45. Accordingly, an area occupied by the reset thin film transistor T3 on the display panel 100 may be reduced, and high PPI designs of panel 100 may thus be achieved.

In one embodiment, referring to FIG. 6, the drain P3 of the drive thin film transistor T1 may be reused as the drain P9 of the reset thin film transistor T3.

For example, the drain P9 of the reset thin film transistor T3 is electrically connected to the drain P3 of the drive thin film transistor T1. When the drain P3 of the drive thin film transistor T1 is reused as the drain P9 of the reset thin film transistor T3, the drain P9 is electrically connected to the oxide channel layer 103 of the switch thin film transistor T3 through a through-hole. Accordingly, a procedure of separately providing a film layer structure for the drain P9 of the reset thin film transistor T3 may be avoided. Thus, certain production processes may be omitted, production efficiency may be improved, and the film structure of the display panel 100 may be simplified.

Figure 7:
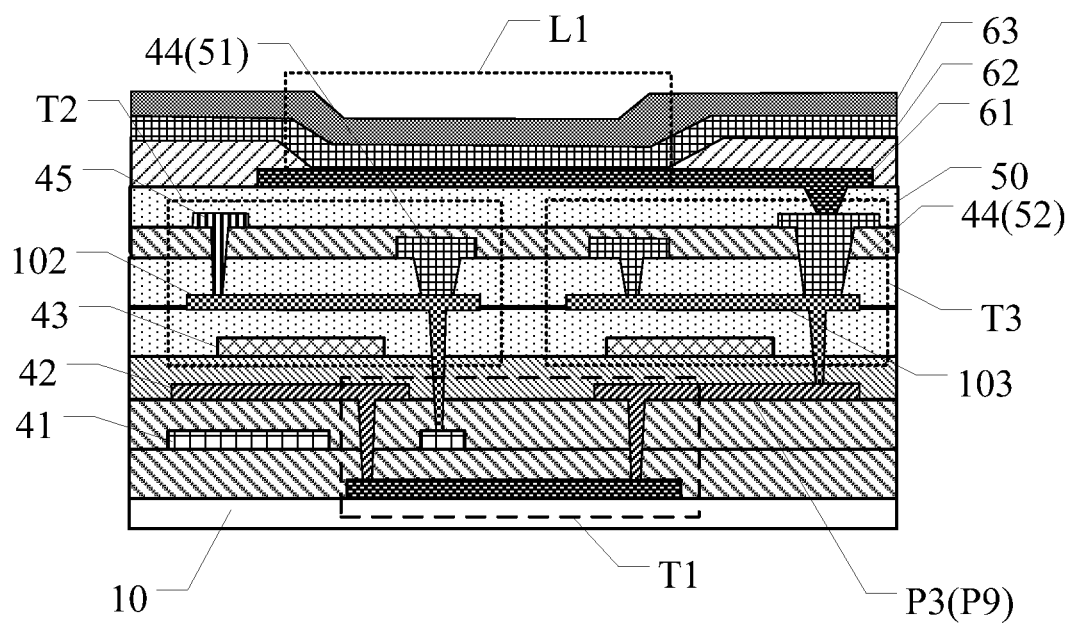
FIG. 7 illustrates another exemplary cross-sectional view at cross section AA' of the exemplary display panel illustrated in FIG. 1, consistent with the disclosed embodiments.

FIG. 7 illustrates another exemplary cross-sectional view at cross section AA' of the exemplary display panel illustrated in FIG. 1. As shown in FIG. 7, the organic light-emitting device L1 is located at a side of the fourth metal layer 44 away from the base substrate. The organic light-emitting device L1 includes an anode 61, a light-emitting layer 62, and a cathode 63, which are disposed in sequence. The anode 61 is coupled to the drain of the drive thin film transistor T1.

For example, FIG. 7 illustrates electrical connection relationships of the drive thin film transistor T1, the switch thin film transistor T2, the reset thin film transistor T3 and the organic light-emitting device L1. At a side of the fourth metal layer 44 and the fifth metal layer 45 away from the base substrate, a planarization film layer 50 may be formed through an insulating layer, and an organic light-emitting device L1 may then be formed on the planarization film layer 50. The organic light-emitting device L1 includes an anode 61, a light-emitting layer 62 and a cathode 63, which are disposed in sequence from a side close to the base substrate to a side away from the base substrate.

In the structure shown in FIG. 7, the anode 61 is coupled to the drain P3 of the drive thin film transistor T1 through a through-hole. As shown in FIG. 7, the anode 61 is electrically connected to the second metal line 52 through a through-hole. Since the oxide channel layer 103 is thin, the second metal line 52 is electrically connected to the drain P9 of the reset thin film transistor T3. Since the drain P3 of the drive thin film transistor T1 is reused as the drain P9 of the reset thin film transistor T3, the anode 61 of the organic light-emitting device L1 is electrically connected to the drain P3 of the drive thin film transistor T1. Under joint actions of the drive thin film transistor T1, the switch thin film transistor T2 and the reset thin film transistor T3, the organic light-emitting device L1 may normally emit light.

Figure 8:
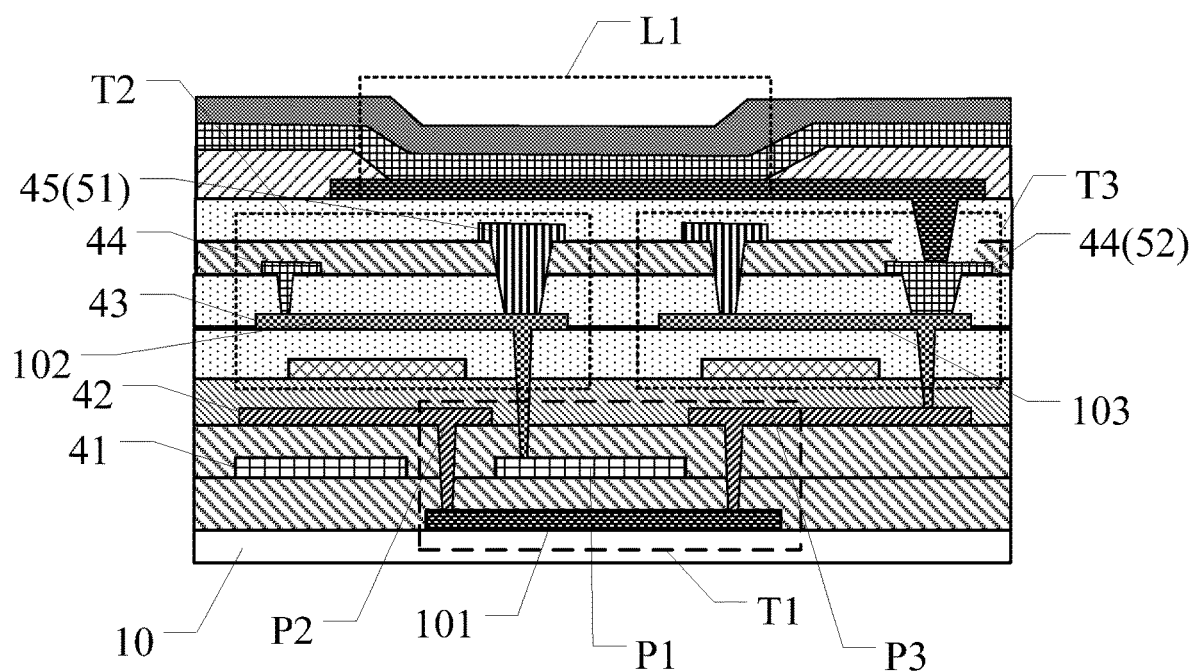
FIG. 8 illustrates another exemplary cross-sectional view at cross section AA' of the exemplary display panel illustrated in FIG. 1, consistent with the disclosed embodiments.

FIG. 8 illustrates another exemplary cross-sectional view at cross section AA' of the exemplary display panel illustrated in FIG. 1. As shown in FIG. 8, the display panel 100 also includes a polysilicon layer 101 located at a side of the first metal layer 41 facing the base substrate 10. Orthographic projections of the gate P1, the source P2 and the drain P3 of the drive thin film transistor T1 on the plane of the base substrate cover the polysilicon layer 101.

For example, referring to FIG. 8, in the display panel 100, the drive thin film transistor T1 is embodied as a top gate structure. That is, the gate P1 of the drive thin film transistor T1 is located at a side of the polysilicon layer 101 away from the base substrate 10. In addition, in a direction perpendicular to the base substrate, the polysilicon layer 101 in the drive thin film transistor T1 is covered by the gate P1, the source P2, and the drain P3 of the drive thin film transistor T1. The polysilicon layer 101 may generate a current when it is exposed to light, affecting driving functions of the drive thin film transistor T1. When the polysilicon layer 101 is covered by the gate electrode P1, the source P2, and the drain P3, the amount of light reflected to the polysilicon layer 101 may be be greatly reduced. Accordingly, an amount of current generated by the polysilicon layer 101 due to light illumination may be reduced, and the operation reliability of the drive thin film transistor T1 may thus be improved.

In one embodiment, in the display panel 100, the oxide channel layer 102 of the switch thin film transistor T2 and the oxide channel layer 103 of the reset thin film transistor T3 have a thickness D1 in a range of approximately 20 nm≤D1≤80 nm.

For example, referring to FIG. 2, the display panel 100 includes the first metal line 51 and the second metal line 52. The first metal line 51 is electrically connected to the drain of the switch thin film transistor T2 through the oxide channel layer 102 of the switch thin film transistor T2. The second metal line 52 is electrically connected to the drain of the reset thin film transistor T3 through the oxide channel layer 103 of the reset thin film transistor T3. When the thickness of the oxide channel layer 102/103 is less than approximately 20 nm, fractures may easily occur, and film formation may be difficult. When the thickness of the oxide channel layer 102/103 is larger than approximately 80 nm, the electrical connection relationship between the first metal line 51 and the drain of the switch thin film transistor T2 may be weakened; and the electrical connection relationship between the second metal line 52 and the drain of the reset thin film transistors T3 may be weakened. When the thickness of the oxide channel layer 102/103 is in a range of approximately 20 nm ≤ D1 ≤ 80 nm, the switch thin film transistor T2 and the reset thin film transistor T3 may have good performances, and the film forming process may be mature.

Figure 9:
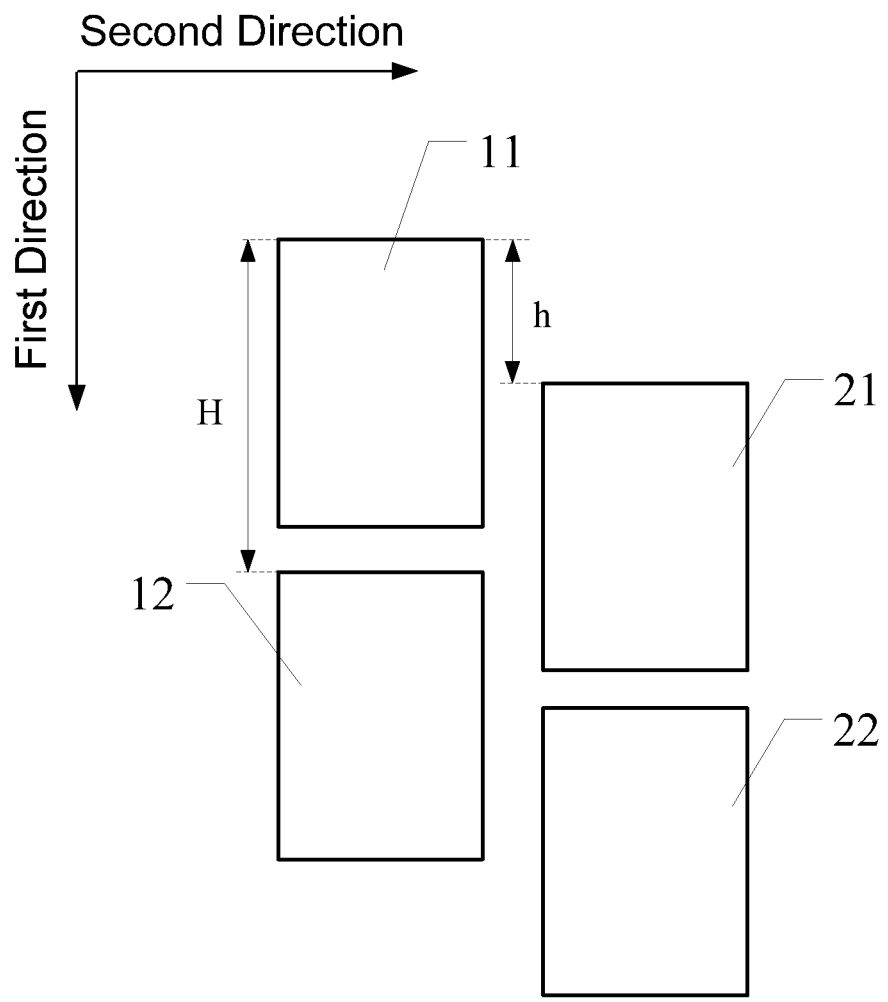
FIG. 9 illustrates an exemplary layout of a portion of pixel units in a display panel consistent with the disclosed embodiments.
Figure 10:
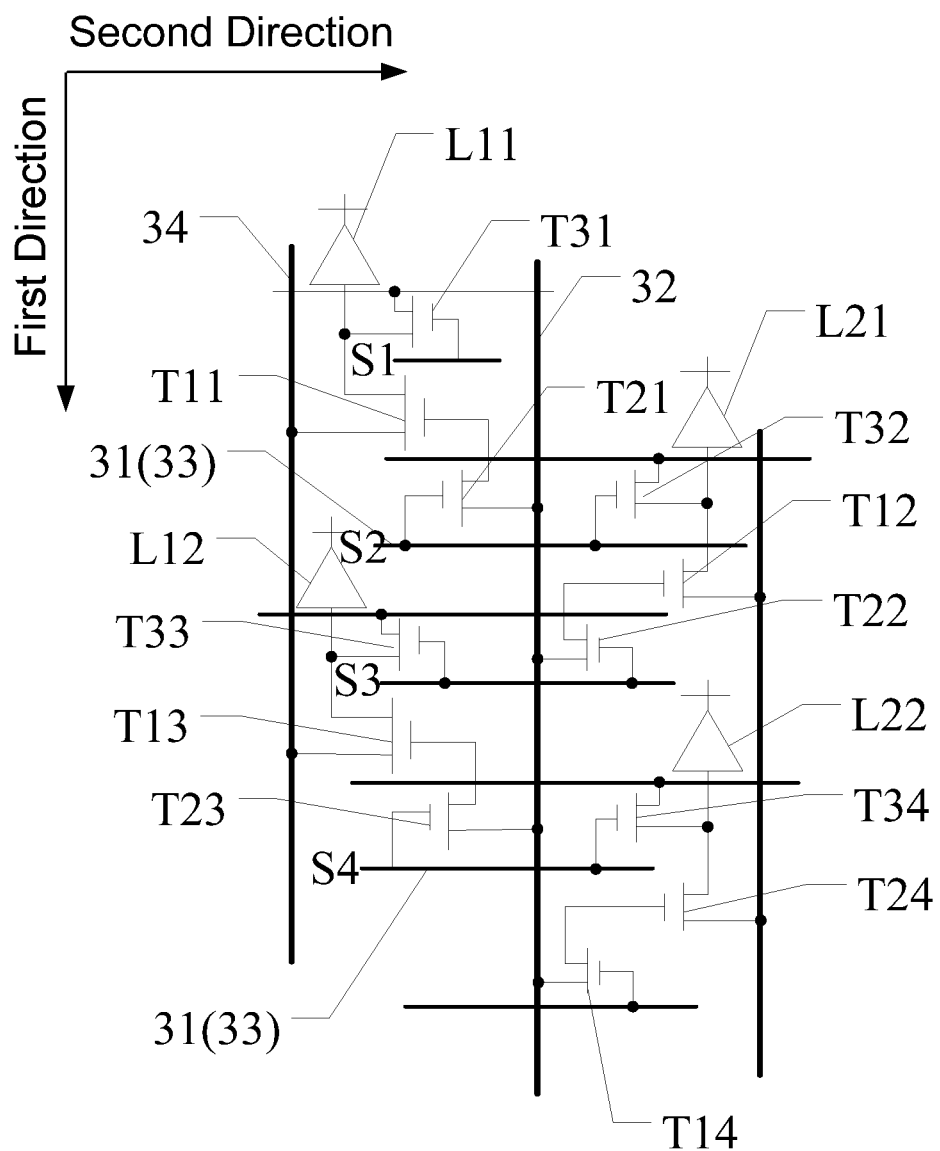
FIG. 10 illustrates an exemplary circuit structure corresponding to the pixel units illustrated in FIG. 9 consistent with the disclosed embodiments.

FIG. 9 illustrates an exemplary layout of a portion of pixel units in a display panel consistent with the disclosed embodiments. FIG. 10 illustrates an exemplary circuit structure corresponding to the pixel units illustrated in FIG. 9. Referring to FIG. 9 and FIG. 10, the pixel units 20 form a plurality of pixel unit columns extending in the first direction. The pixel unit columns include odd columns and even columns. The odd columns and the even columns are alternately arranged in the second direction. The first direction intersects the second direction.

In the first direction, the odd columns and the even columns are misaligned, and a misalignment distance is smaller than a distance between two adjacent pixel units in the first direction. For example, as shown in FIG. 9, in the first direction, a distance between two adjacent pixel units is H, and the misalignment distance between the odd columns and the even columns is h, where 0<h<H.

In one embodiment, in at least a portion of the adjacent odd columns and even columns, each of the switch thin film transistors T2 is connected to a same data line 32, and the data line 32 supplies data signals to the pixel units 20 in the odd columns and even columns.

For example, referring to FIG. 9 and FIG. 10, when the odd columns and the even columns formed by the pixel units 20 are misaligned, the adjacent odd columns and even columns may share same data lines 32. For example, as shown in FIG. 10, the switch thin film transistors T21 and T23 in the pixel units 11 and 12 in the odd column, and the switch thin film transistors T22 and T24 in the even column are simultaneously electrically connected to a same data line 32. The data line 32 may provide data signals to different pixel units in a time-sharing manner to achieve normal display functions of different pixel units. Since the pixel units of the odd columns and the even columns share the data lines 32, wiring complexity of the display panel 100 may be simplified, and space utilization ratio of the display panel 100 may be improved.

In one embodiment, referring to FIG. 9 and FIG. 10, at least a portion of the reset signal lines 33 corresponding to the pixel units located in the odd columns are reused as the gate lines 31 corresponding to the pixel units located in the even columns. At least a portion of the gate lines 31 corresponding to the pixel units in the odd columns are reused as the reset signal lines 33 corresponding to the pixel units in the even columns.

For example, referring to FIG. 9 and FIG. 10, the gate of the switch thin film transistor T21 in the pixel unit 11 is electrically connected to the gate line 31. At a same time, the gate line 31 serves as a reset signal line 33 electrically connected to the reset thin film transistor T32 in the pixel unit 21. The gate of the switch thin film transistor T23 in the pixel unit 12 is electrically connected to the gate line 31. At a same time, the gate line 31 serves as a reset signal line 33 electrically connected to the reset thin film transistor T34 in the pixel unit 22. Accordingly, by reusing the reset signal line 33 as the gate line 31 and reusing the gate line 31 as the reset signal line 33, the wiring complexity of the display panel 100 may be simplified, and the space utilization rate of the display panel 100 may thus be improved.

Figure 11:
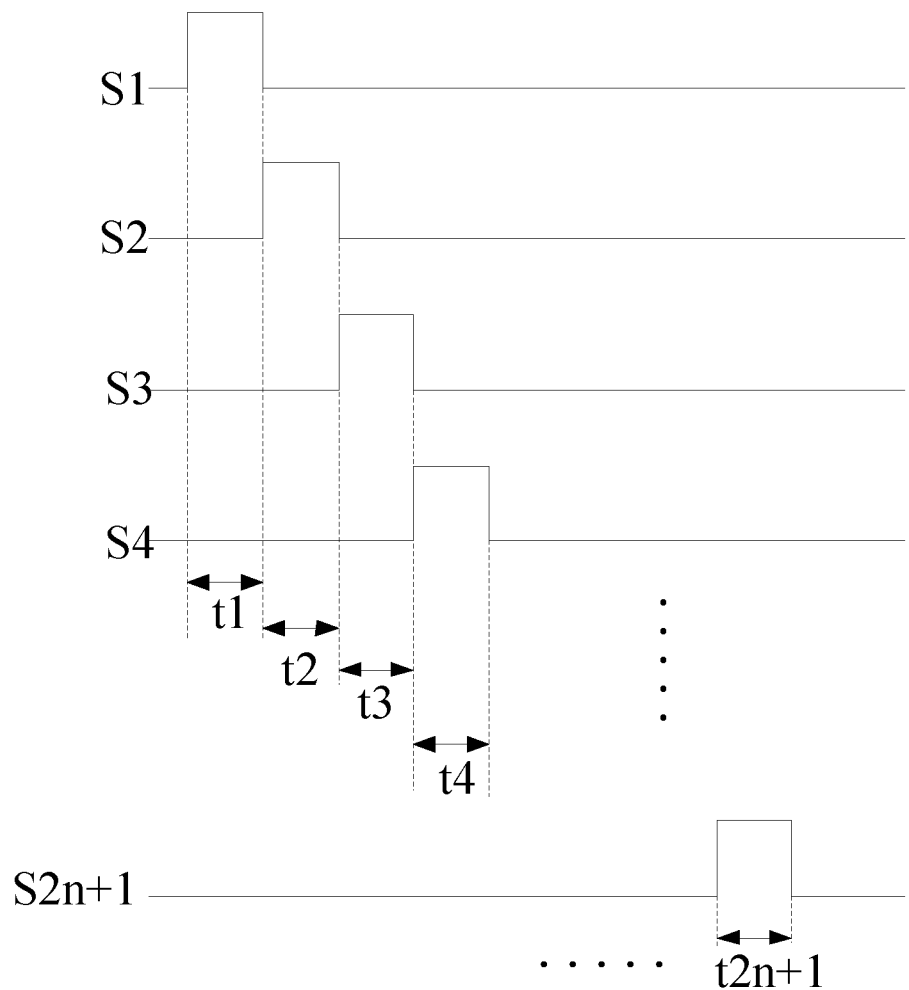
FIG. 11 illustrates an exemplary operation sequence chart of a display panel, consistent with the disclosed embodiments.

An operation sequence of each pixel unit 20 is described below with reference to FIG. 9, FIG. 10 and FIG. 11. FIG. 11 illustrates an exemplary operation sequence chart of a display panel consistent with the present disclosure. In FIG. 11, S1 is an anode reset signal input to the pixel unit 11, and S2 is a gate signal input to the switch thin film transistor T21 in the pixel unit 11 and an anode reset signal input to the pixel unit 21. S3 is a gate signal input to the switch thin film transistor T22 in the pixel unit 22 and an anode reset signal input to the pixel unit 12. S4 is a gate signal input to the switch thin film transistor T23 in the pixel unit 12 and an anode reset signal input to the pixel unit 22.

In period t1, the reset thin film transistor T31 in the pixel unit 11 in the odd column is turned on, and a voltage of the anode 61 of the organic light-emitting device L11 in the pixel unit 11 is reset.

In period t2, the switch thin film transistor T21 in pixel unit 11 in the odd column is turned on, and a data signal is input to the gate of the drive thin film transistor T11 through the switch thin film transistor T21. The drive thin film transistor T11 is then turned on, controlling the organic light-emitting device L11 in the pixel unit 11 to emit light. Meanwhile, since the gate line 31 in the pixel unit 11 is reused as the reset signal line 34 in the pixel unit 21, the reset thin film transistor T32 in in the pixel unit 21 in the even column is turned on, and an anode voltage of the organic light-emitting device L21 in the pixel unit 21 is reset.

In period t3, the switch thin film transistor T22 in the pixel unit 21 is turned on, and a data signal is input to the gate of the drive thin film transistor T12 through the switch thin film transistor T22. The drive thin film transistor T12 is then turned on, controlling the organic light-emitting device L21 in the pixel unit 21 to emit light. Meanwhile, since the gate line 31 in the pixel unit 21 is reused as the reset signal line 33 in the pixel unit 12, the reset thin film transistor T33 in the pixel unit 12 in the odd column is turned on, and an anode voltage of the organic light-emitting device L12 in the pixel unit 12 is reset.

In period t4, the switch thin film transistor T23 in the pixel unit 12 is turned on, and a data signal is input to the gate of the drive thin film transistor T13 through the switch thin film transistor T23. The drive thin film transistor T13 is then turned on, controlling the organic light-emitting device L12 in the pixel unit 12 to emit light. Meanwhile, since the gate line 31 in the pixel unit 12 is reused as the reset signal line 33 in the pixel unit 22, the reset thin film transistor T34 in the pixel unit 22 in the even column is turned on, and an anode voltage of the organic light-emitting device L22 in the pixel unit 22 is reset.

As shown in FIG. 11, since a separate gate line is ultimately required to control a last light-emitting pixel unit to emit light, S2$n$+1 is introduced in the operation sequence chart as a gate signal input to a switch thin film transistor in the last light-emitting pixel unit.

By cycling the steps in the operation sequence chart shown in FIG. 11, normal display of the display panel 100 may be achieved.

In one embodiment, in the display panel 100, the drive thin film transistor T1 may be a PMOS transistor or an NMOS transistor. The present disclosure does not limit types of the drive thin film transistor T1.

It should be noted that, for the switch thin film transistors, the drive thin film transistors, and the reset thin film transistors, the sources in the embodiments of the present disclosure refer to electrodes for inputting signals, and the drains in the embodiments of the present disclosure refer to electrodes for outputting signals.

Figure 12:
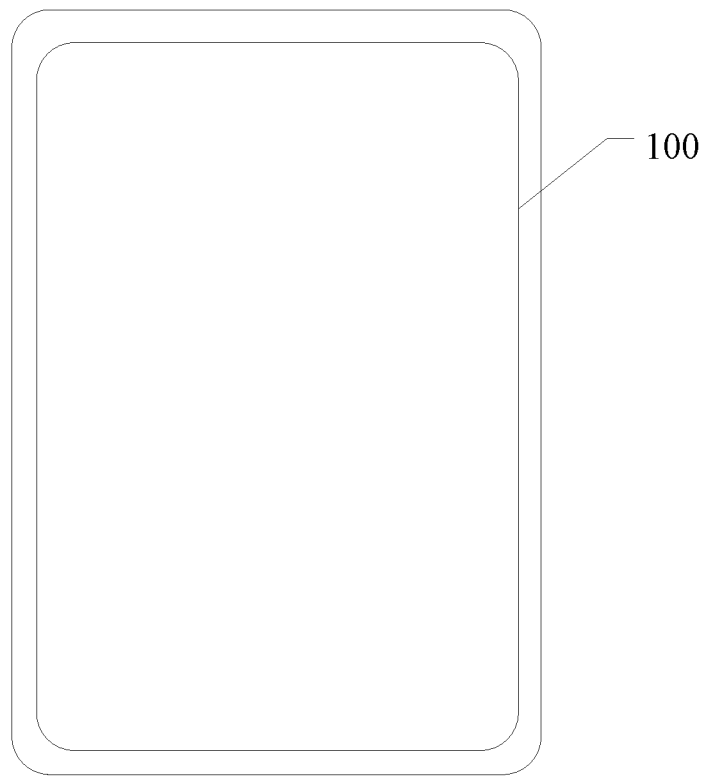
FIG. 12 illustrates a top view of an exemplary display device consistent with the disclosed embodiments.

The present disclosure also provides a display device. FIG. 12 illustrates a top view of an exemplary display device 200 consistent with the disclosed embodiments. The display device 200 includes a display panel 100. The display panel 100 may be any display panel provided by the embodiments of the present disclosure. The display device provided by the present disclosure may be any product or component having a display function, such as a mobile phone, a tablet computer, a television, a display, a notebook computer, a digital photo frame, a navigator, and the like.

As disclosed, the technical solutions of the present disclosure have the following advantages.

In a display panel and a display device provided by the present disclosure, each pixel unit includes a drive thin film transistor, a switch thin film transistor and a reset thin film transistor. A drain of the switch thin film transistor is electrically connected to a gate of the drive thin film transistor, and a drain of the reset thin film transistor is electrically connected to a drain of the drive thin film transistor. A source and the drain of the switch thin film transistor are respectively located at two sides of a gate of the switch thin film transistor; and a source and the drain of the reset thin film transistor are disposed at two sides of a gate of the reset thin film transistor. No bridge is needed for electrically connecting the drain of the switch thin film transistor and the gate of the drive thin film transistor; and no bridge is needed for electrically connecting the drain of the reset thin film transistor and the drain of the drive thin film transistor. As such, areas occupied by the switch thin film transistor and the reset thin film transistor on the display panel may be reduced, and the display panel may thus be provided with more pixel units. Accordingly, high PPI designs of the display panel and the display device may be achieved, and further, resolutions of the display panel and the display device may be improved, and displayed images may be fine and clear.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this disclosure, such other modifications, equivalents, or improvements to the disclosed embodiments are intended to be encompassed within the scope of the present disclosure.

What is claimed is:

1. A display panel, comprising:
   a base substrate; and
   a plurality of pixel units disposed on the base substrate, wherein:
   each of the plurality of pixel units includes a drive thin film transistor, a switch thin film transistor, a reset thin film transistor, and an organic light-emitting device;
   a source of the switch thin film transistor is located at a side of a gate of the switch thin film transistor away from the base substrate and a drain of the switch thin film transistor is located at a side of a gate of the switch thin film transistor close to the base substrate, and a source of the reset thin film transistor is located at a side of a gate of the reset thin film transistor away from the base substrate and a drain of the reset thin film transistor is located at a side of a gate of the reset film the transistor close to the base substrate;
   the drain of the switch thin film transistor is electrically connected to a gate of the drive thin film transistor, and the drain of the reset thin film transistor is electrically connected to a drain of the drive thin film transistor; and
   the drain of the drive thin film transistor is coupled to the organic light-emitting device.

2. The display panel according to claim 1, wherein:
   the switch thin film transistor and the reset thin film transistor are oxide thin film transistors, and the drive thin film transistor is a low-temperature polysilicon thin film transistor.

3. The display panel according to claim 1, further comprising a plurality of gate lines, a plurality of data lines, a plurality of reset signal lines, and a plurality of power signal lines, wherein:
   the gate of each switch thin film transistor is connected to one of the plurality of gate lines, and the source of each switch thin film transistor is connected to one of the plurality of data lines;
   a source of each drive thin film transistor is connected to one of the plurality of power signal lines; and
   the gate of each reset thin film transistor is connected to one of the plurality of reset signal lines, and the source of each reset thin film transistor is connected to reset voltage signals.

4. The display panel according to claim 3, further comprising a first metal layer, a second metal layer, a third metal layer, an oxide channel layer, a fourth metal layer, and a fifth metal layer, wherein:
   the first metal layer, the second metal layer, the third metal layer, the oxide channel layer, the fourth metal layer and the fifth metal layer are sequentially disposed on the base substrate in a direction perpendicular to the base substrate;
   a gate of the drive thin film transistor is located at the first metal layer, and the source and the drain of the drive thin film transistor are located at the second metal layer;
   the gate of the switch thin film transistor and the gate of the reset thin film transistor are located at the third metal layer, and the source of the switch thin film transistor is located at the fourth metal layer;
   the source of the reset thin film transistor is located at the fifth metal layer; and
   the drain of the switch thin film transistor is located between the oxide channel layer and the base substrate, and the drain of the reset thin film transistor is located a side of the oxide channel layer close to the base substrate and a side of the first metal layer away from the base substrate.

5. The display panel according to claim 4, further comprising a first metal line located at a side of the oxide channel layer of the switch thin film transistor away from the base substrate, wherein:
   the first metal line is electrically connected to the oxide channel layer of the switch thin film transistor through a first through-hole;
   in a direction perpendicular to the base substrate, the first metal line and the gate of the switch thin film transistor overlap, the first metal line and the drain of the switch thin film transistor overlap; and
   in a direction perpendicular to the base substrate, the source and the gate of the switch thin film transistor overlap.

6. The display panel according to claim 5, wherein in a direction perpendicular to the base substrate, the first metal line covers the drain of the switch thin film transistor on the plane of the base substrate.

7. The display panel according to claim 5, wherein the first metal line and the source of the switch thin film transistor are located at different film layers; and
   wherein the first metal line is located at the fifth metal layer.

8. The display panel according to claim 4, wherein both the gate of the drive thin film transistor and the drain of the switch thin film transistor are located at the first metal layer.

9. The display panel according to claim 4, further including a second metal line located at a side of the oxide channel layer of the reset thin film transistor away from the substrate, wherein:
   the second metal line is electrically connected to the oxide channel layer of the reset thin film transistor through a second through-hole;
   in a direction perpendicular to the base substrate, the second metal line and the gate and the drain of the reset thin film transistor overlap; and
   in a direction perpendicular to the base substrate, the source and the gate of the reset thin film transistor overlap.

10. The display panel according to claim 9, wherein in a direction perpendicular to the base substrate, the second metal line covers the drain of the reset thin film transistor on the plane of the base substrate.

11. The display panel according to claim 9, wherein the second metal line and the source of the reset thin film transistor is located at different film layers.

12. The display panel according to claim 11, wherein the second metal line is located at the fourth metal layer.

13. The display panel according to claim 9, wherein both the gate of the drive thin film transistor and the drain of the switch thin film transistor are located at the second metal layer.

14. The display panel according to claim 4, wherein:
   the organic light-emitting device is located at a side of the fourth metal layer away from the base substrate;
   the organic light-emitting device includes an anode, a light-emitting layer and a cathode disposed in sequence; and
   the anode is coupled to the drain of the drive thin film transistor.

15. The display panel according to claim 4, further comprising a polysilicon layer located at a side of the first metal layer facing the base substrate, wherein:
in a direction perpendicular to the base substrate, the gate, the source and the drain of the drive thin film transistor cover the polysilicon layer.

16. The display panel according to claim 4, wherein the oxide channel layer has a thickness in a range of approximately 20 nm to 80 nm.

17. The display panel according to claim 3, wherein:
the plurality of pixel units form a plurality of pixel unit columns extending in a first direction, and the plurality of pixel unit columns include odd columns and even columns;
the odd columns and the even columns are alternately arranged in a second direction, and the first direction intersects the second direction; and
in the first direction, the odd columns and the even columns are staggeredly arranged, and a staggered distance is smaller than a distance between two adjacent pixel units in the first direction.

18. The display panel according to claim 17, wherein in at least a portion of adjacent odd-even columns, each of the switch thin film transistors is connected to a same data line, and the data line supplies data signals to the plurality of pixel units in the odd columns and even columns.

19. The display panel according to claim 17, wherein:
at least a portion of the reset signal lines corresponding to the plurality of pixel units located in the odd columns are reused as the gate lines corresponding to the plurality of pixel units located in the even columns; and
at least a portion of the gate lines corresponding to the plurality of pixel units in the odd columns are reused as the reset signal lines corresponding to the plurality of pixel units in the even columns.

20. A display device, comprising a display panel comprising:
a base substrate; and
a plurality of pixel units disposed on the base substrate, wherein:
each of the plurality of pixel units includes a drive thin film transistor, a switch thin film transistor, a reset thin film transistor, and an organic light-emitting device;
a source of the switch thin film transistor is located at a side of a gate of the switch thin film transistor away from the base substrate and a drain of the switch thin film transistor is located at a side of a gate of the switch thin film transistor close to the base substrate, and a source of the reset thin film transistor is located at a side of a gate of the reset thin film transistor away from the base substrate and a drain of the reset thin film transistor is located at a side of a gate of the reset film the transistor close to the base substrate;
the drain of the switch thin film transistor is electrically connected to a gate of the drive thin film transistor, and the drain of the reset thin film transistor is electrically connected to a drain of the drive thin film transistor; and
the drain of the drive thin film transistor is coupled to the organic light-emitting device.

\* \* \* \* \*